United States Patent
Yamaguchi et al.

(10) Patent No.: US 8,530,051 B2
(45) Date of Patent: Sep. 10, 2013

(54) HIGH STRENGTH GEAR, POWER TRANSMISSION MECHANISM USING SAME, AND PRODUCTION METHOD FOR HIGH STRENGTH GEAR

(75) Inventors: Takurou Yamaguchi, Yokohama (JP); Kenji Yamamoto, Kobe (JP)

(73) Assignees: Nissan Motor Co., Ltd., Yokohama-shi (JP); Kabushiki Kaisha Kobe Seiko Sho, Kobe-shi (JP)

( * ) Notice: Subject to any disclaimer, the term of this patent is extended or adjusted under 35 U.S.C. 154(b) by 1809 days.

(21) Appl. No.: 11/878,769

(22) Filed: Jul. 26, 2007

(65) Prior Publication Data

US 2008/0023113 A1 Jan. 31, 2008

(30) Foreign Application Priority Data

Jul. 31, 2006 (JP) .................. 2006-207697

(51) Int. Cl.
*B32B 9/00* (2006.01)
(52) U.S. Cl.
USPC .......... 428/408; 92/136; 192/110 R; 427/577; 428/217
(58) Field of Classification Search
USPC ....... 428/212, 217, 408; 92/136; 192/110 R; 427/577
See application file for complete search history.

(56) References Cited

U.S. PATENT DOCUMENTS

| | | | |
|---|---|---|---|
| 5,785,825 A * | 7/1998 | Hwang et al. ............ 204/192.15 |
| 6,110,329 A | 8/2000 | Holleck et al. | |
| 6,228,471 B1 * | 5/2001 | Neerinck et al. .............. 428/212 |
| 6,638,608 B1 * | 10/2003 | Gui et al. ...................... 428/408 |
| 6,844,068 B1 * | 1/2005 | Miyake et al. ................. 428/408 |
| 7,416,786 B2 * | 8/2008 | Oda et al. ...................... 428/408 |
| 7,955,691 B2 * | 6/2011 | Moronuki et al. ............. 428/217 |
| 2005/0025975 A1 | 2/2005 | Okamoto et al. | |
| 2006/0077593 A1 | 4/2006 | Ueda | |
| 2007/0104953 A1 * | 5/2007 | Sugita .......................... 428/408 |
| 2007/0278090 A1 | 12/2007 | Yamamoto et al. | |

FOREIGN PATENT DOCUMENTS

| CN | 1460741 A | 12/2003 |
|---|---|---|
| CN | 1580613 A | 2/2005 |

(Continued)

OTHER PUBLICATIONS

*Surface roughness—Definitions and designation*, Japanese Industrial Standard, JIS B 0601-1994, Feb. 8, 1994, pp. 1-25, Japanese Standards Association, Tokyo, Japan.

Table 1 Chemical Composition, Japanese Industrial Standard, JIS G 4051: 2005, p. 3, 2005, Japanese Standards Association, Tokyo, Japan.

(Continued)

*Primary Examiner* — Archene Turner
(74) *Attorney, Agent, or Firm* — Foley & Lardner LLP (57) ABSTRACT

A high strength gear used as an element of a power transmission mechanism. The gear includes a base gear formed of an iron-based alloy subjected to carburizing or carbonitriding treatment. The base gear has an engaging surface with which an opposite gear is engaged. The engaging surface of the base gear is coated with a first diamond-like carbon film which has a hydrogen content of not more than 10 atomic % and a surface hardness ranging from 8 to 30 GPa in a nano-indentation test. Additionally, at least a part of the first diamond-like carbon film is coated with a second diamond-like carbon film which has a hydrogen content of not more than 10 atomic % and a surface hardness ranging from 50 to 90 GPa in the nano-indentation test. The second diamond-like carbon film has a surface roughness Ra ranging from 0.1 to 0.2 μm.

8 Claims, 2 Drawing Sheets

(56) References Cited

FOREIGN PATENT DOCUMENTS

| | | | |
|---|---|---|---|
| CN | 1758340 A | | 4/2006 |
| EP | 1 067 211 | * | 1/2001 |
| EP | 1 503 113 A2 | | 2/2005 |
| JP | 07-180774 | * | 7/1995 |
| JP | 11-001013 A | | 1/1999 |
| JP | 2000-128516 | * | 5/2000 |
| JP | 2000-128516 A | | 5/2000 |
| JP | 2000-297373 A | | 10/2000 |
| JP | 2002-322555 A | | 11/2002 |
| JP | 2003-014121 | * | 1/2003 |
| JP | 2003-326069 A | | 11/2003 |
| JP | 2003-336542 A | | 11/2003 |
| JP | 2004-010923 A | | 1/2004 |
| JP | 2004-011018 A | | 1/2004 |
| JP | 2004-137535 A | | 5/2004 |
| JP | 2004-269991 A | | 9/2004 |
| JP | 2005-061610 A | | 3/2005 |
| JP | 2005-213636 A | | 8/2005 |
| JP | 2006-107673 A | | 4/2006 |
| JP | 2006-124806 A | | 5/2006 |

OTHER PUBLICATIONS

Table 2 Chemical Composition, Japanese Industrial Standard, JIS G 4053: 2003, p. 3, 2003, Japanese Standards Association, Tokyo, Japan.

*Nickel Chromium Molybdenum Steels*, Japanese Industrial Standard, JIS G 4103-1979, pp. 1-10, Jun. 1, 1994, Japanese Standards Association, Tokyo, Japan.

*Chromium Steels*, Japanese Industrial Standard, JIS G 4104-1979, pp. 1-10, Jan. 5, 1989, Japanese Standards Association, Tokyo, Japan.

Chromium Molybdenum Steels, Japanese Industrial Standard, JIS G 4105-1979, pp. 1-12, Jun. 7, 1994, Japanese Standards Association, Tokyo, Japan.

*Standard Test Method for Separation of Representative Aromatics and Nonaromatics Fractions of High-Boiling Oils by Elution Chromatography*, ASTM D 2549-91, 1995, pp. 895-900.

Hans-Joachim Scheibe et al., "Deposition of Superhard Amorphous Carbon Films by Pulsed Arc Sources", IEEE Transactions on Plasma Science, Aug. 1997, pp. 685-688, vol. 25, No. 4, IEEE Service Center, Piscataway, NJ, US.

Jewelry Science and Technology, Jun. 23, 2004, p. 23.

* cited by examiner

HIGH STRENGTH GEAR, POWER TRANSMISSION MECHANISM USING SAME, AND PRODUCTION METHOD FOR HIGH STRENGTH GEAR

BACKGROUND OF THE INVENTION

This invention relates to a high strength gear, a power transmission mechanism using the high strength gear and a production method for the high strength gear, and more particularly to the high strength gear which used as a gear of a mechanical element of a variety of mechanical structures such as an automotive vehicle, an industrial machine, an agricultural machine and the like.

It is expected in the future that motor-driven automotive vehicles increase from the viewpoint of coping with environmental problems. Gears of a speed-reducing device used in the motor-driven automotive vehicles are required to reduce a rotational speed (reaching several ten thousand r.p.m.) of an electric motor to a certain low rotational speed through their size is maintained compact. Accordingly, there is a fear of bringing about a surface damage such as seizure and wear of sliding members due to a temperature rise at sliding surfaces.

As a measure of preventing such a surface damage, coating the surface of the sliding members with diamond-like carbon (referred hereafter to as "DLC") has been recently used. The DLC includes bondings of diamond and graphite in a mixed state and macroscopically has a structure seemed amorphous. Accordingly, the DLC has a characteristics intermediate between diamond and graphite and is excellent in hardness and solid lubricating characteristics. As a result, it is expected that the DLC is useful for lowering a friction loss and preventing seizure and wear due to heat generation under sliding, also in CVTs (Continuously Variable Transmissions) with gears and belts.

However, there may arises a problem that the DLC film peels off owing to an internal stress generated under a difference in thermal expansion between the DLC film and a material to be treated and owing to shortage in toughness. This problem becomes serious as the thickness of the DLC film increases.

In view of the above, it has been proposed to laminate a layer of metal or semimetal such as titanium (Ti), zirconium (Zr), chromium (Cr), tungsten (W) or the like on a carbon layer so as to improve the toughness of the carbon layer, as disclosed in Japanese Patent Provisional Publication No. 11-1013.

Additionally, it has been proposed to laminate a high carbon density layer and a low carbon density layer thereby improving the toughness and improving a friction characteristics under a solid lubricating action of abrasion powder in the low carbon density layer, as disclosed in Japanese Patent Provisional Publication No. 2002-322555.

Further, it has been proposed to improve a seizure resistance and a friction characteristics of a sliding member in a lubricating oil by using a DLC film which is obtained by a plasma CVD process and contains 20 to 40 atomic % (referred hereinafter to as "atm %") and 1 to 5 atm % of silicon, as disclosed in Japanese Patent Provisional Publication No. 2003-336542.

Furthermore, it has been proposed to improve a friction characteristics of a sliding member in an engine oil by using a DLC film formed by an ion plating process and contains not more than 10 atm % of hydrogen, as disclosed in Japanese Patent Provisional Publication No. 2000-297373. This seems to be accomplished under the contribution of a grinding effect of particle materials called droplets, of a target material for forming a DLC film. The droplets are unavoidably produced in the ion plating process.

Concerning the above proposals or techniques of Japanese Patent Provisional Publications Nos. 11-1013 and 2002-322555, the improvement in the characteristics is exhibited under no lubrication, and therefore the Publications never discuss the characteristics in a lubricating oil.

Concerning the above proposal or technique of Japanese Patent Provisional Publication No. 2003-336542, although a remarkable friction reduction is exhibited, plasma becomes unstable in case that a film formation is accomplished in the atmosphere of hydrocarbon-based gas particularly by an ion plating process. This causes a misfire during a treatment and therefore there is such a problem as to make it impossible to conduct a stable film formation. Particularly in case that an unevenness is formed like teeth of a gear, a film is difficult to be formed at a concave-shaped base section of the gear as compared with a convex-shaped tip section, and therefore the thickness of the film unavoidably increases throughout the whole gear in order to obtain a certain film thickness also at the base section. This raises a problem of the gear being lowered in peel strength owing to the thickened film, and a long time is required for the film formation thereby lowering stability of the film and making it impossible to select a process of the film formation.

Thus, in the above conventional techniques, it has been difficult to form a DLC film on a gear which film is low in friction in a lubricating oil and cannot peel off even in case of being used under a high bearing pressure and under a high speed sliding.

SUMMARY OF THE INVENTION

It is an object of the present invention to provide an improved sliding member which can effectively overcome drawbacks encountered by conventional sliding members.

Another object of the present invention is to provide an improved sliding member which is excessively lowered in friction coefficient and exhibits a low friction characteristics also in a lubricating oil.

A further object of the present invention is to provide an improved high strength gear which is excessively lowered in friction coefficient, exhibits a low friction characteristics also in a lubricating oil and excellent in tooth surface fatigue strength, an improved power transmission mechanism using the high strength gear, and an improved production method for the high strength gear.

Eager studies have been done by the present inventor in order to solve the above problems. As a result, the present inventors have found to be able to solve the above problems by forming two kinds of diamond-like carbon films having a hydrogen content of not more than 10 atm %, at an engaging surface of the gear.

An aspect of the present invention resides in a sliding member comprising a base material formed of an iron-based alloy subjected to carburizing or carbonitriding treatment, the base material having a sliding surface. The sliding surface of the base material is coated with a first diamond-like carbon. The first diamond-like carbon film has a hydrogen content of not more than 10 atomic % and a surface hardness ranging from 8 to 30 GPa in a nano-indentation test. Additionally, at least a part of the first diamond-like carbon film is coated with a second diamond-like carbon film. The second diamond-like carbon film has a hydrogen content of not more than 10 atomic % and a surface hardness ranging from 50 to 90 GPa in the nano-indentation test. The second diamond-like carbon film has a surface roughness Ra ranging from 0.1 to 0.2 μm.

A second aspect of the present invention resides in a high strength gear comprising a base gear formed of an iron-based alloy subjected to carburizing or carbonitriding treatment. The base gear has an engaging surface with which an opposite gear is engaged. The engaging surface of the base gear is coated with a first diamond-like carbon film. The first diamond-like carbon film has a hydrogen content of not more than 10 atomic % and a surface hardness ranging from 8 to 30 GPa in a nano-indentation test. Additionally, at least a part of the first diamond-like carbon film is coated with a second diamond-like carbon film. The second diamond-like carbon film has a hydrogen content of not more than 10 atomic % and a surface hardness ranging from 50 to 90 GPa in the nano-indentation test. The second diamond-like carbon film has a surface roughness Ra ranging from 0.1 to 0.2 μm.

A third aspect of the present invention resides in a power transmission mechanism comprising a first gear of high strength. The first gear includes a base gear formed of an iron-based alloy subjected to carburizing or carbonitriding treatment, the base gear having an engaging surface, a first diamond-like carbon film with which the base gear is coated, the first diamond-like carbon film having a hydrogen content of not more than 10 atomic % and a surface hardness ranging from 8 to 30 GPa in a nano-indentation test, and a second diamond-like carbon film with which at least a part of the first diamond-like carbon film is coated, the second diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm. Additionally, a second gear is provided adjacent to the first gear and having an engaging surface which is in engagement with the engaging surface of the first gear. The second gear includes a third diamond-like carbon film with which the engaging surface of the second gear is coated, the third diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm.

A fourth aspect of the present invention resides in a method of producing a high strength gear, comprising (a) forming a first diamond-like carbon film on at least a part of an engaging surface of a base gear by a sputtering process under rotation of the base gear relative to a carbon target, the first diamond-like carbon film having a hydrogen content of not more than 10 atomic %; and (b) forming a second diamond-like carbon film on at least a part of the first diamond-like carbon film by an ion plating process in a condition including a first state where rotation of the base gear is stopped and a second state where a rotational speed of the base gear is low, the second diamond-like carbon film having a hydrogen content of not more than 10 atomic %.

DETAILED DESCRIPTION OF THE INVENTION

The present invention will be discussed below in detail. In the following description, all percentages (%) are by mass unless otherwise specified.

A high strength gear comprising a base gear (gear main body) to be treated which base gear is formed of an iron-based alloy and has been subjected to a carburizing treatment or a carbonitriding treatment. The base gear is coated at its engaging surface or sliding surface with a first DLC film. Additionally, a part of or whole surface of the coated first DLC film is coated with a second DLC film by an ion plating process. The first DLC film has a hydrogen content of not more than 10 atm %. The second DLC film has a hydrogen content of not more than 10 atm % and a surface roughness (Ra) ranging from 0.1 to 0.2 μm. The surface roughness (Ra) is according to JIS (Japanese Industrial Standard) B 0601.

Thus, the base gear is provided with a two layer structure of DLC film form at the engaging surface of the base gear thereby exhibiting the following advantageous effects:

The second DLC film (formed by the ion plating process) is sufficient to be small in thickness and therefore tends not to be peeled off. Even if the second DLC film is peeled off, a grinding effect due to droplets can be exhibited, so that friction is lowered in an amount corresponding to the grinding effect in addition to a low friction due to only the DLC film having the hydrogen content of not more than 10 atm %. Additionally, the second DLC film is formed by the ion plating process while the surface roughness (Ra) ranges between 0.1 to 0.2, and therefore a suitable amount of droplets is obtained thereby preventing the DLC film from being cracked and from excessive attack to a surface of an opposite member.

The kind of the iron-based alloy which constitutes the base gear to be treated and having been subjected to carburizing or carbonitriding may be suitably selected according to use of the high strength gear. As the iron-based alloy, ones which cannot be softened having a toughness at a temperature (around 200° C.) during a film formation treatment and be heat-treatable are suitable.

Typical examples of the iron-based alloy are carbon case hardening steels for machine structural use, such as S09CK, S15CK, S20CK and the like, and alloy case hardening steels for machine structural use, for example, nickel-chromium based alloys such as SNC415, SNC815 and the like, nickel-chromium-molybdenum based alloys such as SNCM220, SNCM415, SNCM420, SNCM616, SNCM815 and the like, chromium-based alloys such as SCr415, SCr420 and the like, chromium-molybdenum based alloys such as SCM 415, SCM418, SCM420, SCM421, SCM 822 and the like, and manganese based and manganese-chromium based alloys such as SMn420, SMnC420 and the like. The above examples of the alloys are suitably used as the iron-based alloy of the gear of the present invention. The above-mentioned symbols (such as S09CK) of the above alloys are according to JIS.

In the high strength gear of the present invention, the surface of the first DLC film has a hardness ranging from 20 to 30 GPa in a nano-indentation test. By forming the first DLC film having such a hardness, an excellent low friction characteristics can be obtained in combination with the grinding effect due to the DLC film formed by the ion plating. If the hardness exceeds 30 GPa, the toughness of the film is degraded while it can be difficult to obtain a stable hardness.

It is suitable that the second DLC film has a hardness ranging from 20 to 30 GPa in the nano-indentation test. As the region in which the second DLC film is formed increases, a low friction characteristics can become excellent. Additionally, the second DLC film can exhibit an excellent low friction characteristics also in a lubricating oil, thereby preventing formation of a surface unevenness due to wear.

The above nano-indentation test will be discussed.

The hardness of a material is defined by a bearing pressure applied to the surface of the material and an indentation depth of an impression. In a conventional hardness test, an indenter is indented to the material applying a certain load, and the size of the impression after removing the load is measured. Then, a hardness is calculated based on a measured value of the size taking account of a geometrical factor of the indenter. However, recent minimizing of electronic devices or the like makes it practically impossible to identify the location of an impression and measure the size of the impression in a strength test for a micro-material under a ultra-low load. In view of this, the following test or method has been proposed: The indentation depth (h) of the indenter to a load (P) is dynamically measured, and an evaluation of hardness is made on an indentation load—displacement curve. This test is called "nano-indentation test".

Next, a power transmission mechanism using the high strength gear will be discussed.

The power transmission mechanism according to the present invention is constituted by using two or more high strength gears each of which is the above-discussed high strength gear. The engaging surface (sliding surfaces) of at least one of the adjacent gears (base gears or gear main bodies) coated with the first DLC film is further coated with the second DLC film. In other words, both the two high strength gears may have respectively the second DLC films. Otherwise, only either one of the high strength gears may have the second DLC film.

In a speed reducing gear or a speed increasing gear, it is preferable to form the second DLC films on front and rear sides or faces (drive-side and driven-side) of a gear tooth. This second DLC film can effectively grind the facing or opposite face of an opposite gear tooth upon engagement of all the gear teeth of an opposite gear under right and reverse rotation of the high strength gear. Particularly in case of the gear having a large module, it is preferable to form the second DLC films respectively on the facing or opposite faces of the adjacent two teeth in order to prevent a tip part of each gear tooth from being thickened or swollen, as compared with forming the second DLC films respectively on the front and rear sides of a gear tooth of one gear.

Additionally, it is preferable that a lubricating oil exists between the engaging gears in the power transmission mechanism using the high strength gear.

Here, the above lubricating oil preferably contains a lubricating oil base oil and at least one of additives including a fatty acid ester-based ashless friction modifier, an aliphatic amine-based ashless friction modifier, a phosphoric acid ester-based extreme-pressure additive, polybutenyl succinimide, a derivative of polybutenyl succinimide and zinc dithiophosphate. In other words, the base oil contains at least one of the above additives or any combination of the above additives.

The above lubricating oil base oil is not particularly limited and can be any base oil (compound or compounds) commonly used for a lubricating oil, such as a mineral oil, a synthetic oil, an oil and fat (compound), or any combination of the mineral oil, the synthetic oil and the oil and fat. The lubricating oil is normally liquid and may be replaced with a lubricant such as solid graphite or talc or with semi-solid grease.

Specific examples of the mineral oil include paraffin-based or naphthene-based oil, and n-paraffin, prepared by extracting a lubricating oil fraction from petroleum by atmospheric or reduced-pressure distillation, and then, purifying the obtained lubricating oil fraction by using at least one of the following treatments: solvent deasphalting, solvent extraction, hydrogenolysis, solvent dewaxing, hydrogenation purification, sulfuric acid treatment, clay treatment and the like which may be used in suitable combination. It is general to purify the obtained lubricating oil fraction by using hydrogenation purification or solvent purification. Additionally, it is preferable to use the mineral oil which is obtained by purifying the lubricating oil fraction using high-hydrogenolysis process which is capable of largely decreasing aromatic components, or the mineral oil produced by a process for isomerizing GTL (gas to liquid) Wax.

Specific examples of the synthetic oil include: poly-$\alpha$-olefins (such as 1-octene oligomer, 1-decene oligomer and ethylene-propylene oligomer), hydrides of poly-$\alpha$-olefins, isobutene oligomers, hydrides of isobutene oligomers, isoparaffins, alkylbenzenes, alkylnaphthalenes, diesters (such as ditridecyl glutarate, dioctyl adipate, diisodecyl adipate, ditridecyl adipate and dioctyl sebacate), polyol esters (such as trimethylolpropane caprylate; trimethylolpropane pelargonate; trimethylolpropane ester such as trimethylolpropane isostearinate; pentaerythritol ester such as pentaerythritol-2-ethyl hexanoate and pentaerythritol pelargonate), polyoxyalkylene glycol, dialkyldiphenyl ether, and polyphenyl ether. Among these synthetic oil compounds, preferred are poly-$\alpha$-olefins, such as 1-octene oligomer and 1-decene oligomer and hydrides thereof.

The above-mentioned mineral and synthetic oil (compounds) may be used alone, or in the form of a mixture of any two or more thereof with no limitation on the mixture ratio.

The sulfur content of the base oil is not particularly restricted. The sulfur content is preferably not more than 0.2%, more preferably not more than 0.1%, much more preferably not more than 0.05%, based on the total mass of the base oil. Additionally, it is preferable to use, as the base oil, mineral oil which is purified by hydrogenation or synthetic oil because such oil has a sulfur content of not more than 0.005% or substantially no sulfur content (not more than 5 ppm).

The aromatic content of the base oil is also not particularly restricted. The aromatic content of the base oil is preferably 15% or less, more preferably 10% or less, and most preferably 5% or less in order that the lubricating oil for internal combustion engines maintain its low friction characteristics for a long time. When the aromatic content exceeds 15%, the base oil undesirably deteriorates in oxidation stability. Herein, the aromatic content is defined as the amount of aromatics fractions determined according to ASTM D2549 "Standard Test Method for Separation of Representative Aromatics and Non-aromatics Fractions of High-Boiling Oils by Elution Chromatography".

The kinematic viscosity of the base oil is not particularly restricted. When the lubricating oil is used for an internal combustion engine, the kinematic viscosity of the base oil is preferably 2 mm$^2$/s or higher, more preferably 3 mm$^2$/s and, at the same time, is preferably 20 mm$^2$/s or lower, more preferably 10 mm$^2$/s or lower, most preferably 8 mm$^2$/s or lower, as measured at 100° C. When the kinematic viscosity is lower than 2 mm$^2$/s at 100° C., the lubricating oil can provide a sufficient wear resistance and be inferior in vaporization characteristics. When the kinematic viscosity exceeds 20 mm$^2$/s, the lubricating oil is difficult to exhibit a low frictional characteristics and may be degraded in vaporization characteristics, which are not preferable. In connection with the present invention, at least two base oils may be freely selected to be mixed to form a mixture, in which the kenamatic viscosity of the single base oil may be out of the above-mentioned range as far as the kinematic viscosity of the mixture at 100° C. falls within the above-mentioned preferable range.

The viscosity index of the base oil is not particularly restricted, and is preferably 80 or higher, more preferably 100 or higher, most preferably 120 or higher, when the lubricating oil is used for an internal combustion engine. Increasing the viscosity index of the base oil can provide the lubricating oil for the internal combustion engine, excellent in low temperature viscosity characteristics and fuel economy performance.

Examples of the fatty acid ester-based ashless friction modifier and the aliphatic amine-based ashless friction modifier are an fatty acid ester and an aliphatic amine each having $C_6$-$C_{30}$ straight or branched hydrocarbon chains or groups, preferably $C_8$-$C_{24}$ straight or branched hydrocarbon chains, more preferably $C_{10}$-$C_{20}$ straight or branched hydrocarbon chains. When the carbon number of the hydrocarbon chain is not within the range of 6 to 30, there arises a possibility that the lubricating oil may not produce a sufficient friction reducing effect as expected. It will be understood that a suitable mixture of fatty acid ester and the aliphatic amine may be used.

Specific examples of the $C_6$-$C_{30}$ straight or branched hydrocarbon chain include: alkyl groups, such as hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl, tetracosyl, pentacosyl, hexacosyl, heptacosyl, octacosyl, nonacosyl and triacontyl; and alkenyl groups, such as hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl, icosenyl, heneicosenyl, docosenyl, tricosenyl, tetracosenyl, pentacosenyl, hexacosenyl, heptacosenyl, octacosenyl, nonacosenyl and triacontenyl. The above alkyl and alkenyl groups include all possible isomers. Additionally, the position of double bond of alkenyl groups is free.

The fatty acid ester can be exemplified by esters of fatty acids having the above $C_6$-$C_{30}$ hydrocarbon groups or chains and monohydric or polyhydric aliphatic alcohols. Specific examples of such fatty acid esters include glycerol monooleate, glycerol dioleate, sorbitan monoleate and sorbitan dioleate.

The aliphatic amine can be exemplified by aliphatic monoamines and alkylene oxide adducts thereof, aliphatic polyamines, imidazoline compounds, and derivatives thereof. Specific examples of such aliphatic amines include: aliphatic amine compounds, such as laurylamine, lauryldiethylamine, lauryldiethanolamine, dodecyldipropanolamine, palmitylamine, stearylamine, stearyltetraethylenepentamine, oleylamine, oleylpropylenediamine, oleyldiethanolamine and N-hydroxyethyloleylimidazolyne; adducts of the above aliphatic amines ($C_6$-$C_{28}$ alkyl or alkenyl amines) with alkylene oxides, such as N,N-dipolyoxyalkylene-N-lkylamines; and acid-modified compounds prepared by reacting the above aliphatic amines with $C_2$-$C_{30}$ monocarboxylic acids (such as fatty acids) or $C_2$-$C_{30}$ polycarboxylic acids (such as oxalic acid, phthalic acid, trimellitic acid and pyromellitic acid) so as to neutralize or amidate the whole or part of the remaining amino and/or imino groups. In connection with the present invention, N,N-dipolyoxyethylene-N-oleylamine is preferably used.

The amount of the fatty acid ester-based ashless friction modifier and/or the aliphatic amine-based ashless friction modifier added in the lubricating oil is not particularly restricted, and is preferably 0.05 to 3.0%, more preferably 0.1 to 2.0%, and most preferably 0.5 to 1.4%, based on the total mass of the lubricating oil. When the amount of the fatty acid ester-based ashless friction modifier and/or the aliphatic amine-based ashless friction modifier is less than 0.05%, there arises a possibility that the lubricating oil may not produce a sufficient friction reducing effect. When the amount of the fatty acid ester-based ashless friction modifier and/or the aliphatic amine-based ashless friction modifier exceeds 3.0%, the lubricating oil produce a good friction reducing effect but undesirably deteriorates in storage stability and compatibility to cause precipitations.

Examples of the polybutenyl succinimide include compounds represented by the following general formulas (1) and (2).

In each of the formulas (1) and (2), n represents an integer of 1 to 5, preferably 2 to 4, so as to attain a good detergent effect. Further, PIB represents a polybutenyl group derived from polybutene. The polybutene can be prepared by polymerizing high-purity isobutene or a mixture of 1-butene and isobutene in the presence of a boron fluoride catalyst or an aluminum chloride catalyst in such a manner that the polybutene attains a number-average molecular weight of 900 to 3,500, preferably 1,000 to 2,000. When the number-average molecular weight of the polybutene is less than 900, there is a possibility of failing to attain a sufficient detergent effect. When the number-average molecular weight of the polybutene exceeds 3,500, the polybutene may undesirably deteriorate in low-temperature fluidity. In the production of the polybutenyl succinimide, the polybutene may be used after purified by removing trace amounts of fluorine and chlorine residues, which result from the above polybutene production catalyst, by any suitable treatment (such as adsorption process or washing process). The amount of the fluorine and chlorine residues is preferably controlled to 50 ppm or less, more preferably 10 ppm or less, most preferably 1 ppm or less.

The production method of the polybutenyl succinimide is not particularly restricted. For example, the polybutenyl succinimide can be prepared by reacting an chloride of the above-mentioned polybutene, or the polybutene from which fluorine and chlorine residues are removed, with maleic anhydride at 100 to 200° C. to form polybutenyl succinate, and then, reacting the thus-formed polybutenyl succinate with polyamine (such as diethylene triamine, triethylene tetramine, tetraethylene pentamine or pentaethylene hexamine).

The polybutenyl succinimide derivative can be exemplified by boron- and acid-modified compounds obtained by reacting the polybutenyl succinimide of the formulas (1) and (2) with boron compounds or oxygen-containing organic compounds so as to neutralize or amidate the whole or part of the remaining amino and/or imide groups. Among these, boron-contain- ing polybutenyl succinimide, especially boron-containing bis(polybutenyl)succinimide, is preferably used.

The above boron compound can be a boric acid, a borate or a boric acid ester. Specific examples of the boric acid include orthoboric acid, metaboric acid and paraboric acid. Specific examples of the borate include: ammonium salts including ammonium borates, such as ammonium metaborate, ammonium tetraborate, ammonium pentaborate and ammonium octaborate. Specific examples of the boric acid ester include: esters of boric acids and alkylalcohols (preferably $C_1$-$C_6$ alkylalcohols), such as monomethyl borate, dimethyl borate, trimethyl borate, monoethyl borate, diethyl borate, triethyl borate, monopropyl borate, dipropyl borate, tripropyl borate, monobutyl borate, dibutyl borate and tributyl borate. Herein, the content ratio of nitrogen to boron (B/N) by mass in the boron-containing polybutenyl succinimide is usually 0.1 to 3, preferably 0.2 to 1.

The above oxygen-containing organic compound can be exemplified by: $C_1$-$C_{30}$ monocarboxylic acids, such as formic acid, acetic acid, glycolic acid, propionic acid, lactic acid, butyric acid, valeric acid, caproic acid, enanthic acid, caprylic acid, pelargonic acid, capric acid, undecylic acid, lauric acid, tridecanoic acid, myristic acid, pentadecanoic acid, palmitic acid, margaric acid, stearic acid, oleic acid, nonadecanoic acid and eicosanoic acid; $C_2$-$C_{30}$ polycarboxylic acids, such as oxalic acid, phthalic acid, trimellitic acid and pyromellitic acid, and anhydrides and esters thereof; $C_2$-$C_6$ alkylene oxides; and hydroxy(poly)oxyalkylene carbonates.

The amount of the polybutenyl succinimide and/or the derivative thereof added in the lubricating oil used in the present invention is not particularly restricted, and is preferably 0.1 to 15%, more preferably 1.0 to 12%, based on the total mass of the lubricating oil. When the amount of the polybutenyl succinimide and/or the derivative thereof is less than 0.1%, there arises a possibility of failing to attain a sufficient detergent effect. It becomes uneconomical when the amount of the polybutenyl succinimide and/or the derivative thereof exceeds 15%. In addition, such a large amount of the polybutenyl succinimide and/or the derivative thereof tends to cause a deterioration in demulsification ability.

Examples of the above zinc dithiophosphate include compounds represented by the following general formula (3):

(3)

In the general formula (3), $R^4$, $R^5$, $R^6$ and $R^7$ each represent $C_1$-$C_{24}$ hydrocarbon groups. The $C_1$-$C_{24}$ hydrocarbon group is preferably a $C_1$-$C_{24}$ straight-chain or branched-chain alkyl group, a $C_3$-$C_{24}$ straight-chain or branched-chain alkenyl group, a $C_5$-$C_{13}$ cycloalkyl or straight-chain or branched-chain alkylcycloalkyl group, a $C_6$-$C_{18}$ aryl or straight-chain or branched-chain alkylaryl group, or a $C_7$-$C_{19}$ arylalkyl group. The above alkyl group or alkenyl group can be primary, secondary or tertiary.

Specific examples of $R^4$, $R^5$, $R^6$ and $R^7$ include: alkyl groups, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl and tetracosyl; alkenyl groups, such as propenyl, isopropenyl, butenyl, butadienyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl (oleyl), nonadecenyl, icosenyl, heneicosenyl, docosenyl, tricosenyl and tetracosenyl; cycloalkyl groups, such as cyclopentyl, cyclohexyl and cycloheptyl; alkylcycloalkyl groups, such as methylcyclopentyl, dimethylcyclopentyl, ethylcyclopentyl, propylcyclopentyl, ethylmethylcyclopentyl, trimethylcyclopentyl, diethylcyclopentyl, ethyldimethylcyclopentyl, propylmethylcyclopentyl, propylethylcyclopentyl, di-propylcyclopentyl, propylethylmethylcyclopentyl, methylcyclohexyl, dimethylcyclohexyl, ethylcyclohexyl, propylcyclohexyl, ethylmethylcyclohexyl, trimethylcyclohexyl, diethylcyclohexyl, ethyldimethylcyclohexyl, propylmethylcyclohexyl, propylethylcyclohexyl, di-propylcyclohexyl, propylethylmethylcyclohexyl, methylcycloheptyl, dimethylcycloheptyl, ethylcycloheptyl, propylcycloheptyl, ethylmethylcycloheptyl, trimethylcycloheptyl, diethylcycloheptyl, ethyldimethylcycloheptyl, propylmethylcycloheptyl, propylethylcycloheptyl, di-propylcycloheptyl and propylethylmethylcycloheptyl; aryl groups, such as phenyl and naphthyl; alkylaryl groups, such as tolyl, xylyl, ethylphenyl, propylphenyl, ethylmethylphenyl, trimethylphenyl, butylphenyl, propylmethylphenyl, diethylphenyl, ethyldimethylphenyl, tetramethylphenyl, pentylphenyl, hexylphenyl, heptylphenyl, octylphenyl, nonylphenyl, decylphenyl, undecylphenyl and dodecylphenyl; and arylalkyl groups, such as benzyl, methylbenzyl, dimethylbenzyl, phenethyl, methylphenethyl and dimethylphenethyl. The above hydrocarbon groups include all possible isomers.

The above-mentioned hydrocarbon groups formable with $R^4$, $R^5$, $R^6$ and $R^7$ include all considerable straight or branched chain structures. The position of double bond of alkenyl group, the bonding position of alkyl group to cycloalkyl group and the bonding position of alkyl group to aryl group are free. Among the above-mentioned hydrocarbon groups, especially preferable ones are straight or branched alkyl groups having a carbon number ranging from 1 to 18, aryl groups having a carbon number ranging from 6 to 18, and straight or branched alkylaryl groups.

Specific examples of the zinc dithiophosphate include zinc diisopropyldithiophosphate, zinc diisobutyldithiophosphate, zinc di-sec-butyldithiophosphate, zinc di-sec-pentyldithiophosphate, zinc di-n-hexyldithiophosphate, zinc di-sec-hexyldithiophosphate, zinc di-octyldithiophosphate, zinc di-n-decylthiophosphate, zinc di-2-ethylhexyldithiophosphate, zinc di-n-decyldithiophosphate, zinc di-n-dodecyldithiophosphate, zinc diisotridecyldithiophosphate and mixtures thereof.

The amount of the zinc dithiophosphate added in the lubricating oil is not particularly restricted. The zinc dithiophosphate is preferably contained in an amount of 0.1% or less, more preferably in an amount of 0.06% or less, most preferably in a minimum effective amount, in terms of the phosphorus element based on the total mass of the lubricating oil in order to produce a higher friction reducing effect. When the amount of the zinc dithiophosphate exceeds 0.1% in terms of the phosphorus element based on the total mass of the lubricating oil, there arises a possibility of inhibiting the effect of the fatty acid ester-based ashless friction modifier and/or the aliphatic amine-based ashless friction modifier, particularly at a sliding surface.

The zinc dithiophosphate can be prepared by any known method. For example, the zinc dithiophosphate may be prepared by reacting alcohols or phenols having the above $R^4$, $R^5$, $R^6$ and $R^7$ hydrocarbon groups with diphosphorous pentaoxide ($P_2O_5$) to form dithiophosphoric acid, and then, neutralizing the thus-formed dithiophosphoric acid with zinc oxide. Here, the molecular structure of zinc dithiophosphate differs according to the alcohols or phenols used as a raw material for the zinc dithiophosphate production. It will be understood that at least two kinds of zinc dithiophosphates represented by the above general formula (3) may be mixed at a suitable ratio so as to be used.

The above lubricating oil can exhibit an extremely excellent low friction characteristics in case that it exists at the sliding surface between the DLC and the DLC or between the DLC and a iron-based member. In order to raise performances required particularly for the lubricating oil (composition) of internal combustion engines, the lubricating oil may contain other additives, such as a metallic detergent, an antioxidant, a viscosity index improver, a friction modifier other than the above-mentioned fatty acid ester-based ashless friction modifier and/or the aliphatic amine-based ashless friction modifier, an ashless dispersant other than the above-mentioned polybutenyl succinimide and/or the derivative thereof, an anti-wear agent or extreme-pressure additive, a rust inhibitor, a nonionic surfactant, a deemulsifier, a metal deactivator and/or an anti-foaming agent, when used in an internal combustion engine. These additives may be used alone or in the form of a mixture of two or more thereof so as to meet the lubricating oil performance required.

The metallic detergent can be any metallic-detergent compound commonly used for a lubricating oil. Specific examples of the metallic detergent usable include sulfonates, phenates and salicylates and naphthenates of alkali metals or alkali-earth metals; and mixtures of two or more thereof. Examples of the alkali metals include sodium (Na) and potassium (K), and examples of the alkali-earth metals include calcium (Ca) and magnesium (Mg). In connection with the present invention, sodium and calcium sulfonates, sodium and calcium phenates, and sodium and calcium salicylates are suitably used.

The total base number and amount of the metallic detergent can be selected in accordance with the lubricating oil performance required. The total base number of the metallic detergent is usually 0 to 500 mgKOH/g, preferably 150 to 400 mgKOH/g, as measured by so-called perchloric acid method. The amount of the metallic detergent is usually 0.1 to 10% based on the total mass of the lubricating oil.

The antioxidant can be any antioxidant compound commonly used for a lubricating oil. Specific examples of the antioxidant usable in connection with the present invention include: phenolic antioxidants, such as 4,4'-methylenebis(2, 6-di-tertbutylphenol) and octadecyl-3-(3,5-di-tertbutyl-4-hydroxyphenyl)propionate; amino antioxidants, such as phenyl-α-naphthylamine, alkylphenyl-α-naphthylamine and alkyldiphenylamine; and mixtures of two or more thereof. The amount of the antioxidant is usually 0.01 to 5% based on the total mass of the lubricating oil.

The viscosity index improver can be exemplified by: non-dispersion type viscosity index improvers, such as copolymers of one or two monomers selected from various methacrylic acids, and hydrides of the copolymers; and dispersion type viscosity index improvers, such as copolymers of methacrylates (including nitrogen compounds). There may be also used, as the viscosity index improver, copolymers of ethylene and α-olefins (such as propylene, 1-butene and 1-pentene) and hydrides thereof, polyisobutylenes and hydrides thereof, a hydrogenated copolymer of styrene and diene, a copolymer of styrene and maleic anhydride and polyalkylstyrenes.

The molecular weight of the viscosity index improver needs to be selected in view of shear stability. For example, the number-average molecular weight of the viscosity index improver is desirably in a range of 5,000 to 1,000,000, more desirably 100,000 to 800,000, for dispersion or non-dispersion type polymethacrylates; in a range of 800 to 5,000 for polyisobutylenes and hydrides thereof; and in a range of 800 to 300,000, more desirably 10,000 to 200,000 for ethylene/α-olefin copolymers and hydrides thereof. The above viscosity index improving compounds can be used alone or in the form of a mixture of two or more thereof. The amount of the viscosity index improver is preferably 0.1 to 40.0% based on the total mass of the lubricating oil.

The friction modifier other than the above-mentioned fatty acid ester-based ashless friction modifier and/or the aliphatic amine-based ashless friction modifier can be exemplified by ashless friction modifiers, such as boric acid esters, higher alcohols and aliphatic ethers, and metallic friction modifiers, such as molybdenum dithiophosphate, molybdenum dithiocarbamate and molybdenum disulfide.

The ashless dispersant other than the above-mentioned polybutenyl succinimide and/or the derivative thereof can be exemplified by polybutenylbenzylamines and polybutenylamines each having polybutenyl groups of number-average molecular weight of 900 to 3,500, polybutenyl succinimides having polybutenyl groups of number-average molecular weight of less than 900 and derivatives thereof.

The anti-friction agent or extreme-pressure additive can be exemplified by disulfides, sulfurized fats and oils, olefin sulfides, phosphate esters having one to three $C_2$-$C_{20}$ hydrocarbon groups, thiophosphate esters, phosphite esters, thiophosphite esters and amine salts of these esters.

The rust inhibitor can be exemplified by alkylbenzene sulfonates, dinonylnaphthalene sulfonates, esters of alkenylsuccinic acids and esters of polyhydric alcohols.

The nonionic surfactant and the deemulsifier can be exemplified by noionic polyalkylene glycol surfactants, such as polyoxyethylene alkylethers, polyoxyethylene alkylphenylethers and polyoxyethylene alkylnaphthyleters.

The metal deactivator can be exemplified by imidazoline compounds, pyrimidine derivatives, thiazole and benzotriazole.

The anti-foaming agent can be exemplified by silicones, fluorosilicones and fluoroalkylethers.

Each of the friction modifier other than the fatty acid ester-based ashless friction modifier and/or the aliphatic amine-based ashless friction modifier, the ashless dispersant other than the polybutenyl succinimide and/or the derivative thereof, the anti-wear agent or extreme-pressure additive, the rust inhibitor and the demulsifier is usually contained in an amount of 0.01 to 5% based on the total mass of the lubricating oil, and the metal deactivator is contained in an amount of 0.0005 to 1% based on the total mass of the lubricating oil.

Additionally, a lubricant whose main component is a compound containing hydroxyl group may be supplied to the sliding surface between the sliding member of the present invention and an iron-based or aluminum-based material, thereby obtaining a further improved friction lowering effect. Examples of the lubricant are alcohols, preferably glycerol or ethylene glycol.

Next, production method of the high strength gear according to the present invention will be discussed in detail.

The production method of the high strength gear according to the present invention is featured by carrying out the following Steps 1 and 2:

Step 1:

A base gear (gear main body) to be treated is rotated relative to a carbon target, in which a first DLC film having a hydrogen content of not more than 10 atm % is formed at a part of or whole the engaging surface (sliding surface) of the gear.

Step 2:

The gear (gear main body) is in a condition of being stopped in rotation or in a low rotational speed condition, in which the second DLC film is formed at least a part of the surface of the first DLC film.

With the above, particularly at the Step 2, an object to be coated with the film by the ion plating process is only one tooth, and therefore a film formation can be completed within a short time. Additionally, a time in which a base section (difficult to be coated with a film) of each gear tooth faces the target is long as compared with a case where an object is rotated, and therefore also the base section tends to be readily coated with the second DLC film. The rotational speed of the gear to be treated at the Step 1 changes according to the shape and size of the gear, in which it is preferable to set the rotational speed within a range of from about 1 to about 10 r.p.m. In the step 2, an aero-lap treatment may be accomplished after the film formation by the ion plating process. At this time, the size and amount of droplets peculiar to the ion plating process are controlled thereby causing the gear to exhibit a particularly excellent low friction characteristics also in a lubricating oil.

EXPERIMENT FOR EXAMPLES AND COMPARATIVE EXAMPLES

The present invention will be more readily understood with reference to the following Examples in comparison with Comparative Examples; however, these Examples are intended to illustrate the invention and are not to be construed to limit the scope of the invention.

1. Film Forming Apparatus

An arc ion plating (referred hereinafter to as "AIP")/unbalanced magnetron sputtering (referred hereafter to as "UBMS") complex apparatus produced by Kobe Steel, Ltd. is used as a film forming apparatus.

Figure 1:
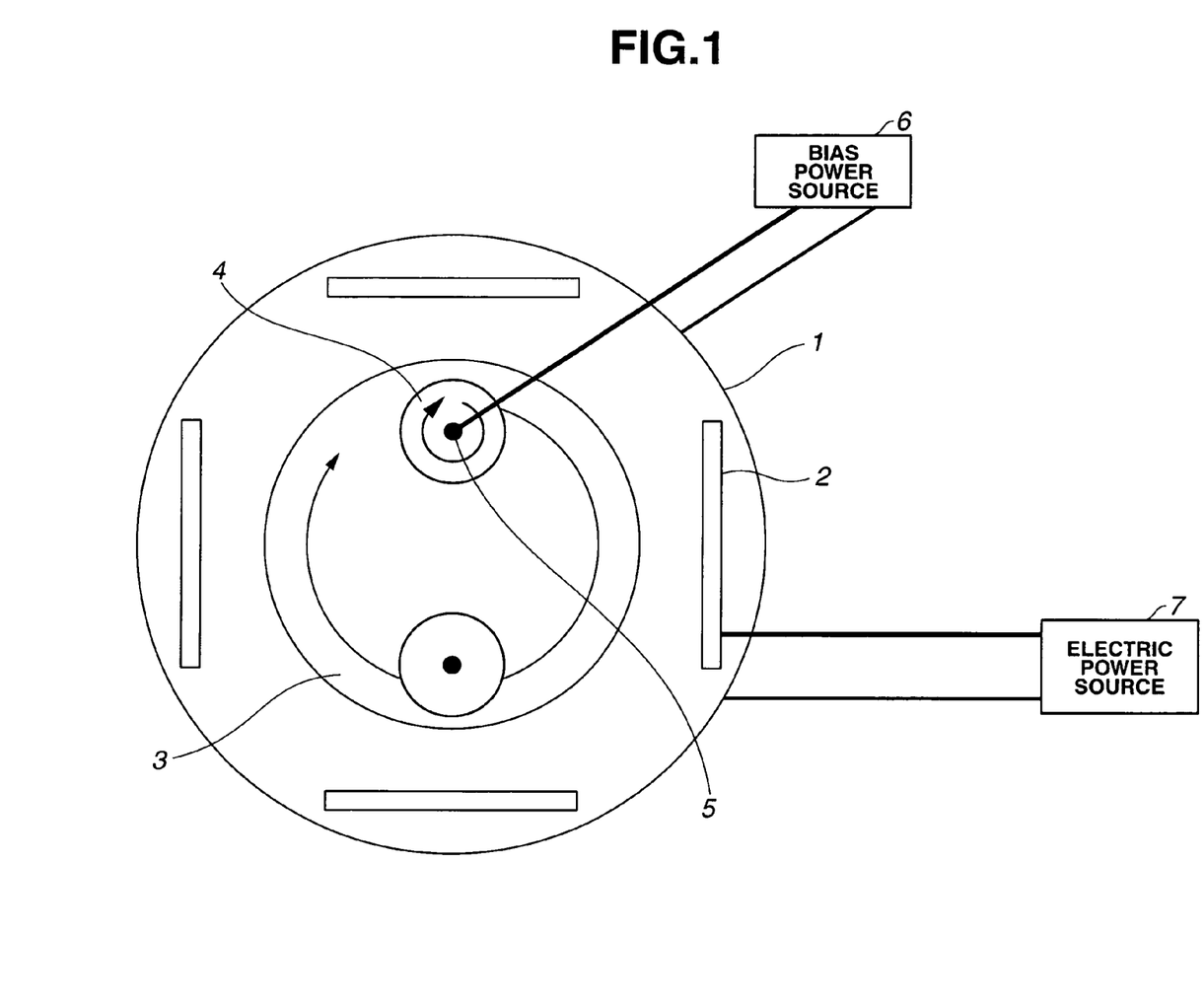
FIG. 1 is a schematic illustration of a film forming chamber section of an apparatus for forming DLC films of high strength gears according to the present invention.

The film forming chamber section of the above apparatus is schematically shown in FIG. 1. Vacuum chamber 1 is maintained under vacuum by means of a diffusion pump, in which argon gas or methane gas may be suitably introduced into the vacuum chamber. A plurality of vaporizing sources 2 are provided. AIP or UBMS may be selected as a film forming process, and graphite or metal may be selected as a target material. Additionally, evaporating sources 2 are connected to an electric power source 7. A part to be treated is set on a holder 5 for the part to be treated so that a film formation on the part is accomplished in front of a target or evaporating source 2 under rotation of rotatable tables 3, 4 on which the holders 5 are respectively disposed. The holders 5 are supplied with bias voltage from a bias power source 6.

2. Treatment Condition

After alkali-cleaning, a specimen base gear (gear main body) is subjected to ion cleaning under a degree of vacuum of $10^{-4}$ to $10^{-5}$ Pa in an atmospheric gas of Ar 0.6 Pa. After the cleaning, a chromium layer is formed on the specimen base gear as a substrate. The thickness of the chromium layer changes in a tip section and in a base section of each gear tooth, in which the thickness is 0.2 μm at a section around the pitch circle of the gear.

Thereafter, a DLC film is formed on the chromium layer. As shown in Table 1, the DLC film having a hydrogen content of not more than 10 atm % is formed on all teeth by UBMS in almost all specimen base gears except for a specimen base gear of a part of Comparative Examples, in which the DLC film has a thickness of 1 μm.

Thereafter, rotation of each rotatable tables 3, 4 is stopped at a position facing a AIP evaporating source, and a film formation for a lower layer is accomplished. In a part of Examples and Comparative Examples, the rotatable tables 3, 4 are rotated thereby accomplishing a film formation on all teeth of the specimen base gear.

In all Examples, no hydrocarbon-based gas is introduced into vacuum chamber 1. In a part of Comparative Examples, bias voltage is changed thereby forming hard and soft layers which are laminated, or a DLC film to which metal or the like is added is formed. Additionally, methane gas is introduced into the chamber 1 thereby inspecting the effect of this gas introduction.

3. Test

Figure 2:
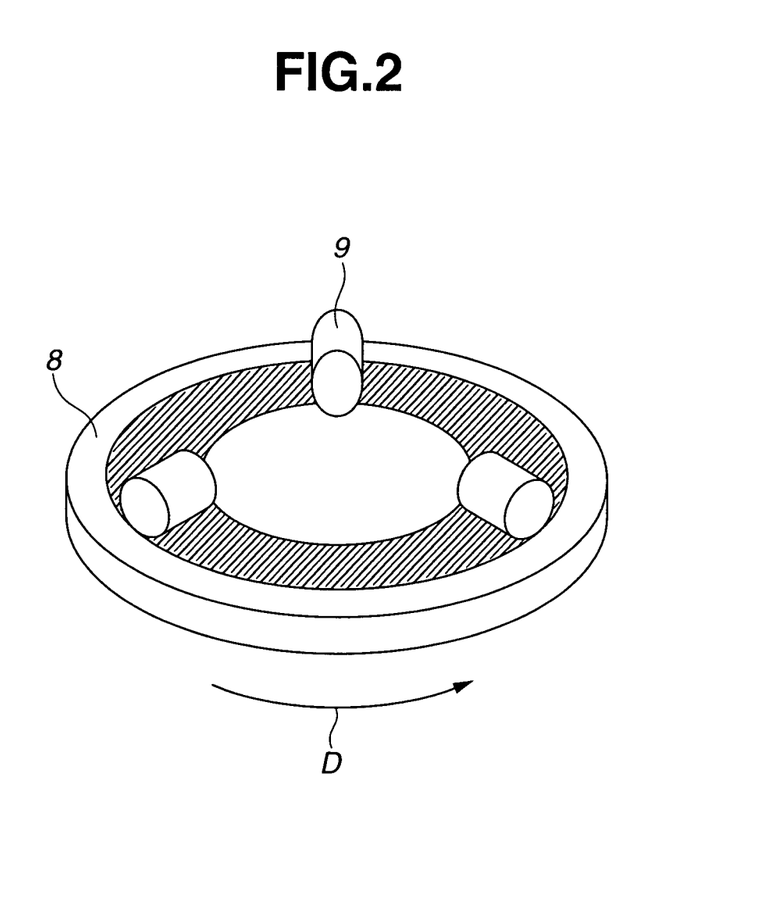
FIG. 2 is a schematic perspective view of an essential part of a friction tester for inspect a peel strength and a friction performance of the DLC films of the high strength gears according to the present invention.

In order to inspect a peel strength and a friction performance of the DLC film, a gear unit test is conducted using a motor bench or friction tester as schematically shown in FIG. 2. In this gear unit test, three pinion gears 9 are in engagement with an annular gear of a disc 8 so as to from a gear unit, in which the disc is rotationally driven in a direction D. Three (first, second and third) step operations are made on the gear unit, each step operation being for 10 minutes. The first, second and third operations are respectively under a condition of a rotational speed of 1000 r.p.m. and of an input torque of 20 Nm, a condition of a rotational speed of 3000 r.p.m. and of an input torque of 60 Nm, and a condition of a rotational speed of 5000 r.p.m. and of an input torque of 90 Nm.

The peel strength is inspected by observing an engaging surface of the gears after the gear unit test as to whether the DLC films peel off or not. The friction performance is inspected as a gear loss ratio which is a ratio of a gear loss of the gear unit relative to a gear loss of the gear unit having no DLC film (Comparative Example 1) on the assumption that the gear loss of the gear unit having no DLC film is 1. In order to raise the sensitivity of measurement of the gear loss, the gear unit has the following specifications and driven through a two-stage speed reduction using planetary gears.

Specification of Gears (Base Gears):

The number of the pinion gears: three; module: 0.87; the number of teeth: 24 (pinion gears) and 60 (gear of the disc); and helix angle of threads: 25°.

Material of Gears (Base Gears):

A material of SCM420H according to JIS is selected as the material of the gears. After gear cutting, the gears are subjected to carburizing and quenching and to tempering so as to have a surface hardness of 720 Hv (Vickers hardness). The gears to be coated with the DLC films or film are the pinion gears, in which the engaging surface of each pinion gear has a surface roughness (Ra) of 0.07 upon grinding. The opposite member (gear of the disc) has a surface roughness (Ra) of 0.2.

Test Oil:

A genuine automatic transmission oil "Matic-D (trade name)" of Nissan Motor Co., Ltd. is used as a lubricating oil for the gear unit, in which supply of the transmission oil is made at 100° C. and at a flow rate of 4 liters per minutes.

Surface Hardness:

The surface hardness of the first and second DLC films (lower and surface upper layers) after the film formation is measured by a ultra-light load thin film hardness tester produced by Digital Instruments, Inc. and according to the above-discussed "nano-indentation test".

The above test was conducted on Examples 1 to 4 and Comparative Examples 1 to 10 whose film forming conditions shown in Table 1. Test results of Examples and Comparative Examples are shown in Table 1.

TABLE 1

| | Lower layer (first DLC film) | | | | | Upper layer (second DLC film) | | | | | | Results | |
|---|---|---|---|---|---|---|---|---|---|---|---|---|---|
| | Film formation process | Bias voltage (V) | Hardness (GPa) | Added material | Methane gas | Film formation process | Bias voltage (V) | Hardness (GPa) | Methane gas | DLC film formation region | DLC film surface roughness | Peeling after test | Gear loss ratio |
| Example 1 | UBMS | −80 | 22 | — | — | AIP | −100 | 71 | — | A part | 0.19 | Nil | 0.79 |
| Example 2 | UBMS | −160 | 28 | — | — | AIP | −200 | 73 | — | A part | 0.18 | Nil | 0.75 |
| Example 3 | UBMS | −240 | 21 | — | — | AIP | −150 | 87 | — | A part | 0.14 | Nil | 0.72 |
| Example 4 | UBMS | −200 | 27 | — | — | AIP | −170 | 86 | — | All teeth | 0.12 | Nil | 0.68 |
| Comp. example 1 | — | — | — | — | — | — | — | — | — | — | — | — | 1.00 |
| Comp. example 2 | UBMS | −40 | 11 | — | — | — | — | — | — | — | 0.09 | Peeled | 1.15 |
| Comp. example 3 | UBMS | −300 | 13 | — | — | — | — | — | — | — | 0.08 | Peeled | 1.06 |
| Comp. example 4 | UBMS | −100 | 13 | — | 10% | AIP | −200 | 72 | 10% | A part | 0.16 | Nil | 0.92 |
| Comp. example 5 | UBMS | −160 | 6 | Cr | — | — | — | — | — | — | 0.10 | Nil | 0.98 |
| Comp. example 6 | UBMS | −200 | 10 | W | — | — | — | — | — | — | 0.12 | Nil | 1.02 |
| Comp. example 7 | UBMS | −100 | 5 | Si | — | — | — | — | — | — | 0.11 | Nil | 0.97 |
| Comp. example 8 | UBMS | −200 | 25 | — | — | UBMS | −50 | 10 | — | All teeth | 0.07 | Partly peeled | 0.98 |
| Comp. example 9 | AIP | −240 | 23 | — | — | — | — | — | — | — | 0.25 | peeled | 1.11 |
| Comp. example 10 | UBMS | −200 | 25 | — | — | AIP | −350 | 56 | 10% | All teeth | 0.29 | Partly peeled | 0.91 |

Note:
"—" indicates no execution.

As appreciated from the test results in Table 1, in Examples 1 to 4 as embodiments of the high strength gear according to the present invention, the DLC films were not peeled off after the test while the gear loss could be largely reduced as compared with that in Comparative Example 1 having no DLC film. Particularly in Example 4, all teeth were coated with the upper layer (second) DLC film, and therefore an excellent gear loss lowering effect was exhibited. However, since film forming speed in Example 4 became low owing to misfire of plasma during a film formation, a practically sufficient gear loss lowering effect could be obtained in Examples 1 to 3 in which a part of teeth was coated with the upper layer (second) DLC film.

The engaging surface of the opposite gear was ground and formed as a mirror finished surface, which seemed to largely contribute to a gear loss lowering. Accordingly, concerning a DLC film formation region at which the upper layer DLC film was formed, it is sufficient that the upper layer DLC film was formed on facing two engaging faces (drive surface and driven surface) of adjacent two teeth. Because, one engaging face of one tooth of a gear can engage with all teeth of an opposite gear thereby exhibiting a sufficient grinding effect. It is a matter of course that a peel strength and a gear loss lowering effect were not degraded if the film formation is made on a tooth or teeth near the object tooth for film formation, during the film formation of the object tooth.

In Comparative Examples 2 and 3, since setting of bias voltage is unsuitable, the hardness of the gear could not meet the range of the surface hardness of the present invention. As a result, a DLC film was lost after the test while the gear loss could not be lowered.

In Comparative Example 4, owing to addition of methane gas, the hardness of the DLC film having the hydrogen content of not more than 10 atm % became too low, and therefore peeling of the DLC film did not occur; however, the gear loss cannot be so lowered.

In Comparative Examples 5 to 7, although a metal (as an added material) was added, the surface hardness was low while the surface roughness was large, and therefore the gear loss lowering effect could be hardly exhibited in an oil.

In Comparative Example 8, a soft DLC film was formed as the upper layer; however, the gear loss lowering could not made in an oil.

In Comparative Example 9, since a DLC film having a hydrogen content of not more than 10 atm % could not be formed as the lower layer by UBMS, a DLC film as the upper layer was difficult to be formed on the lower layer and therefore was peeled off.

In Comparative Example 10, methane gas was introduced during formation of the upper layer while the amount of droplets was excessive so as to degrade the surface roughness. As a result, peeling of the upper layer occurred while the gear loss was not so lowered.

As will be understood from the above, according to the present invention, a gear is coated at its engaging surface with two kinds of the diamond-like carbon films, thereby being furthermore lowered in friction coefficient exhibiting a low friction characteristics also in a lubricating oil. Thus, high strength gears excellent in tooth surface fatigue strength can be obtained.

The entire contents of Japanese Patent Applications P2006-207697 (filed Jul. 31, 2006) are incorporated herein by reference.

Although the invention has been described above by reference to certain embodiments and examples of the invention, the invention is not limited to the embodiments and examples described above. Modifications and variations of the embodiments and examples described above will occur to those skilled in the art, in light of the above teachings. The scope of the invention is defined with reference to the following claims.

What is claimed is:

1. A sliding member comprising:
   a base material formed of an iron alloy subjected to carburizing or carbonitriding treatment, the base material having a sliding surface;
   a first diamond-like carbon film with which the sliding surface of the base material is coated, the first diamond-like carbon film having a hydrogen content of not more than 10 atomic % and a surface hardness ranging from 8 to 30 GPa in a nano-indentation test; and
   a second diamond-like carbon film with which at least a part of the first diamond-like carbon film is coated, the second diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm.

2. A sliding member as claimed in claim 1, wherein the first diamond-like carbon film with which the sliding surface of the base material is coated is formed by a sputtering process, and the second diamond-like carbon film is formed by an ion plating process.

3. A high strength gear comprising:
   a base gear formed of an iron alloy subjected to carburizing or carbonitriding treatment, the base gear having an engaging surface with which an opposite gear is engaged;
   a first diamond-like carbon film with which the engaging surface of the base gear is coated, the first diamond-like carbon film having a hydrogen content of not more than 10 atomic % and a surface hardness ranging from 8 to 30 GPa in a nano-indentation test; and
   a second diamond-like carbon film with which at least a part of the first diamond-like carbon film is coated, the second diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm.

4. A high strength gear as claimed in claim 3, wherein the second diamond-like carbon film is formed on the first diamond-like carbon film formed on a part of gear teeth of the base gear.

5. A high strength gear as claimed in claim 4, wherein the second diamond-like carbon film is formed on the first diamond-like carbon film formed on a gear tooth of the base gear.

6. A power transmission mechanism comprising:
   a first gear of high strength, including
   a base gear formed of an iron alloy subjected to carburizing or carbonitriding treatment, the base gear having an engaging surface,
   a first diamond-like carbon film with which the base gear is coated, the first diamond-like carbon film having a hydrogen content of not more than 10 atomic % and a surface hardness ranging from 8 to 30 GPa in a nano-indentation test, and
   a second diamond-like carbon film with which at least a part of the first diamond-like carbon film is coated, the second diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm; and
   a second gear adjacent to the first gear and having an engaging surface which is in engagement with the engaging surface of the first gear, the second gear including
   a third diamond-like carbon film with which the engaging surface of the second gear is coated, the third diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm.

7. A power transmission mechanism as claimed in claim 6, wherein a lubricating oil exists between the first and second gears.

8. A method of producing a high strength gear, comprising:
   providing a base gear formed of an iron alloy subjected to carburizing or carbonitriding treatment, the base gear having an engaging surface;
   forming a first diamond-like carbon film on at least a part of the engaging surface of the base gear by a sputtering process under rotation of the base gear relative to a carbon target, the first diamond-like carbon film having a hydrogen content of not more than 10 atomic % and a surface hardness ranging from 8 to 30 GPa in a nano-indentation test; and
   forming a second diamond-like carbon film on at least a part of the first diamond-like carbon film by an ion plating process in a condition including a first state where rotation of the base gear is stopped and a second state where a rotational speed of the base gear is low, the second diamond-like carbon film having a hydrogen content of not more than 10 atomic % and a surface hardness ranging from 50 to 90 GPa in the nano-indentation test, the second diamond-like carbon film having a surface roughness Ra ranging from 0.1 to 0.2 μm.

* * * * *